United States Patent
Ho et al.

(10) Patent No.: US 7,994,837 B1
(45) Date of Patent: Aug. 9, 2011

(54) TECHNIQUES FOR PHASE INTERPOLATION

(75) Inventors: Vinh Van Ho, San Jose, CA (US); Tien Duc Pham, San Jose, CA (US); Tim Tri Hoang, San Jose, CA (US)

(73) Assignee: Altera Corporation, San Jose, CA (US)

( * ) Notice: Subject to any disclaimer, the term of this patent is extended or adjusted under 35 U.S.C. 154(b) by 12 days.

(21) Appl. No.: 12/537,634

(22) Filed: Aug. 7, 2009

(51) Int. Cl.
   *H03H 11/16* (2006.01)
(52) U.S. Cl. .................................. 327/231; 327/233
(58) Field of Classification Search ................. None
   See application file for complete search history.

(56) References Cited

U.S. PATENT DOCUMENTS

| | | | |
|---|---|---|---|
| 6,111,445 A | 8/2000 | Zerbe et al. | |
| 6,359,486 B1 * | 3/2002 | Chen | 327/231 |
| 6,943,606 B2 * | 9/2005 | Dunning et al. | 327/231 |
| 7,135,905 B2 | 11/2006 | Teo et al. | |
| 7,180,352 B2 * | 2/2007 | Mooney et al. | 327/237 |
| 7,266,169 B2 * | 9/2007 | Zhang | 375/375 |
| 7,409,012 B2 | 8/2008 | Martin et al. | |
| 7,425,856 B2 * | 9/2008 | Abel et al. | 327/231 |
| 7,486,145 B2 * | 2/2009 | Floyd et al. | 331/1 A |
| 7,508,272 B2 * | 3/2009 | Fallahi et al. | 331/2 |
| 7,532,053 B2 | 5/2009 | Rausch | |
| 7,545,188 B1 * | 6/2009 | Xu et al. | 327/157 |
| 7,551,013 B2 * | 6/2009 | Kim et al. | 327/231 |
| 7,579,891 B2 * | 8/2009 | Ebner | 327/237 |
| 2009/0195281 A1 * | 8/2009 | Tamura et al. | 327/163 |

OTHER PUBLICATIONS

Muneo Fukaishi, et al., "A 20-Gb/s CMOS Multichannel Transmitter and Receiver Chip Set for Ultra-High-Resolution Digital Displays," IEEE Journal of Solid-State Circuits, vol. 35, No. 11, Nov. 2000, pp. 1611-1618.
Rainer Kreienkamp, et al., "A 10-Gb/s CMOS Clock and Data Recovery Circuit With an Analog Phase Interpolator," IEEE Journal of Solid-State Circuits, vol. 40, No. 3, Mar. 2005, pp. 736-743.
Stefanos Sidiropoulos, et al., "A Semidigital Dual Delay-Locked Loop," IEEE Journal of Solid-State Circuits, vol. 32, No. 11, Nov. 1997, pp. 1683-1692.
Kostas Pagiamtzis, "ECE1352 Analog Integrated Circuits Reading Assignment: Phase Interpolating Circuits," Nov. 12, 2001, pp. 1-19.

* cited by examiner

*Primary Examiner* — Cassandra Cox
(74) *Attorney, Agent, or Firm* — Steven J. Cahill

(57) ABSTRACT

A phase interpolator circuit can include first and second transistors coupled to form a differential pair, first and second load circuits, a first switch circuit coupled between the first transistor and the first load circuit, a second switch circuit coupled between the second transistor and the second load circuit, a current source circuit, and a third switch circuit coupled between the differential pair and the current source circuit. A phase interpolator circuit can include three differential pairs of transistors. Six periodic input signals having six different phases are concurrently provided to control inputs of transistors in the three differential pairs of transistors. The phase interpolator circuit generates a selected phase in an output signal in response to four of the periodic input signals.

22 Claims, 11 Drawing Sheets

TECHNIQUES FOR PHASE INTERPOLATION

BACKGROUND OF THE INVENTION

The present invention relates to electronic circuits, and more particularly, to techniques for phase interpolation.

A digital periodic clock signal is often used to sample a data signal that is transmitted to an integrated circuit from an external source. Different techniques can be used to align the rising and falling edges of the clock signal with respect to a sampling window of the data signal so that the data signal can be sampled accurately. As the clock signal frequency and the data rate increases, the sampling window decreases, and the sampling timing is more constrained. A phase interpolator circuit is an example of a circuit that can be used to generate a desired phase shift in a high frequency sampling clock signal.

FIG. 1A illustrates a prior art phase interpolator system. The system of FIG. 1A includes a control block 10, a multiplexer block 15, slew rate circuits 21-24, and phase interpolator 30. The system of FIG. 1A was fabricated in the Stratix® IV GX field programmable gate array manufactured by Altera Corporation of San Jose, Calif. Phase interpolator 30 includes two differential pairs formed by n-channel MOSFETs 41-44 and variable current sources 51-52.

A phase interpolator circuit can generate any one of a number of different phases in a periodic output signal in response to periodic input signals. A phase interpolator circuit can generate a sinusoidal output voltage signal $V_{OUT}$ that is a weighted sum of two sinusoidal voltage input signals, as shown in equations (1)-(3).

$$V_{OUT} = (\alpha \times \sin(\omega t)) + (\beta \times \cos(\omega t)) = c \times \sin(\omega t + \theta) \quad (1)$$

$$c = \sqrt{\alpha^2 + \beta^2} \quad (2)$$

$$\theta = \arctan(\beta/\alpha) \quad (3)$$

The phase interpolator can generate a phase shift $\theta$ in $V_{OUT}$ between 0° and 360° relative to an input clock signal. A desired phase shift in $V_{OUT}$ can be generated by setting the values of the control codes $\alpha$ and $\beta$ as a weighted summation of two variable current sources, such as current sources 51-52.

In the system of FIG. 1A, multiplexers in multiplexer block 15 select four of the clock signals C0, C45, C90, C135, C180, C225, C270, and C315 as output clock signals CLKA, CLKB, CLKC, and CLKD based on control signals from control block 10. The four selected clock signals CLKA, CLKB, CLKC, and CLKD are transmitted to slew rate circuits 21-24. Slew rate circuits 21-24 convert clock signals CLKA, CLKB, CLKC, and CLKD into four signals that are more sinusoidal in shape. The four sinusoidal signals are transmitted to the gate terminals of transistors 41-44 in phase interpolator 30 as cos ωt, −cos ωt, sin ωt, and −sin ωt, respectively. Phase interpolator 30 generates periodic output signals OUT0 and OUT180.

The four selected clock signals CLKA, CLKB, CLKC, and CLKD determine which one of 8 different 45° wide regions RG0-RG7 between 0° and 360° the phase shift in OUT0 occurs in. FIG. 1B illustrates the 8 regions RG0-RG7 between 0° and 360°. Clock signals C0, C45, C90, C135, C180, C225, C270, and C315 have relative phases of 0°, 45°, 90°, 135°, 180°, 225°, 270°, and 315°, respectively. Multiplexer block 15 selects the 4 clock signals shown in one of the columns of Table 1 below as clock signals CLKA, CLKB, CLKC, and CLKD to generate a phase shift in OUT0 that is within the region indicated in the top row of that column.

TABLE 1

| Region  | RG0  | RG1  | RG2  | RG3  | RG4  | RG5  | RG6  | RG7  |
|---------|------|------|------|------|------|------|------|------|
| cosωt   | C0   | C45  | C90  | C135 | C180 | C225 | C270 | C315 |
| −cosωt  | C180 | C225 | C270 | C315 | C0   | C45  | C90  | C135 |
| sinωt   | C45  | C90  | C135 | C180 | C225 | C270 | C315 | C0   |
| −sinωt  | C225 | C270 | C315 | C0   | C45  | C90  | C135 | C180 |

Control block 10 includes an 8-bit shift register that controls the weight current ratios of current sources 51-52 and a 3-bit counter that selects the region RG0-RG7 that the phase of OUT0 is generated in. The currents through current sources 51-52 are varied to change the phase shift of OUT0 within the selected region RG0-RG7.

BRIEF SUMMARY OF THE INVENTION

In one embodiment, a phase interpolator circuit includes first and second transistors coupled to form a differential pair, first and second load circuits, a first switch circuit coupled between the first transistor and the first load circuit, a second switch circuit coupled between the second transistor and the second load circuit, a current source circuit, and a third switch circuit coupled between the differential pair and the current source circuit.

In another embodiment, a phase interpolator circuit includes at least three differential pairs of transistors. At least six periodic input signals having six different phases are concurrently provided to control inputs of transistors in the three differential pairs of transistors. The phase interpolator circuit generates a selected phase in an output signal in response to four of the periodic input signals.

In yet another embodiment, a phase interpolator circuit includes a first differential pair of transistors receiving first and second periodic input signals at control inputs, a second differential pair of transistors receiving a constant reference signal at two control inputs, first and second load circuits coupled to the second differential pair, a first switch circuit coupled to a first transistor in the first differential pair and the first load circuit, and a second switch circuit coupled to a second transistor in the first differential pair and the second load circuit.

Various objects, features, and advantages of the present invention will become apparent upon consideration of the following detailed description and the accompanying drawings.

DETAILED DESCRIPTION OF THE INVENTION

Figure 1A:
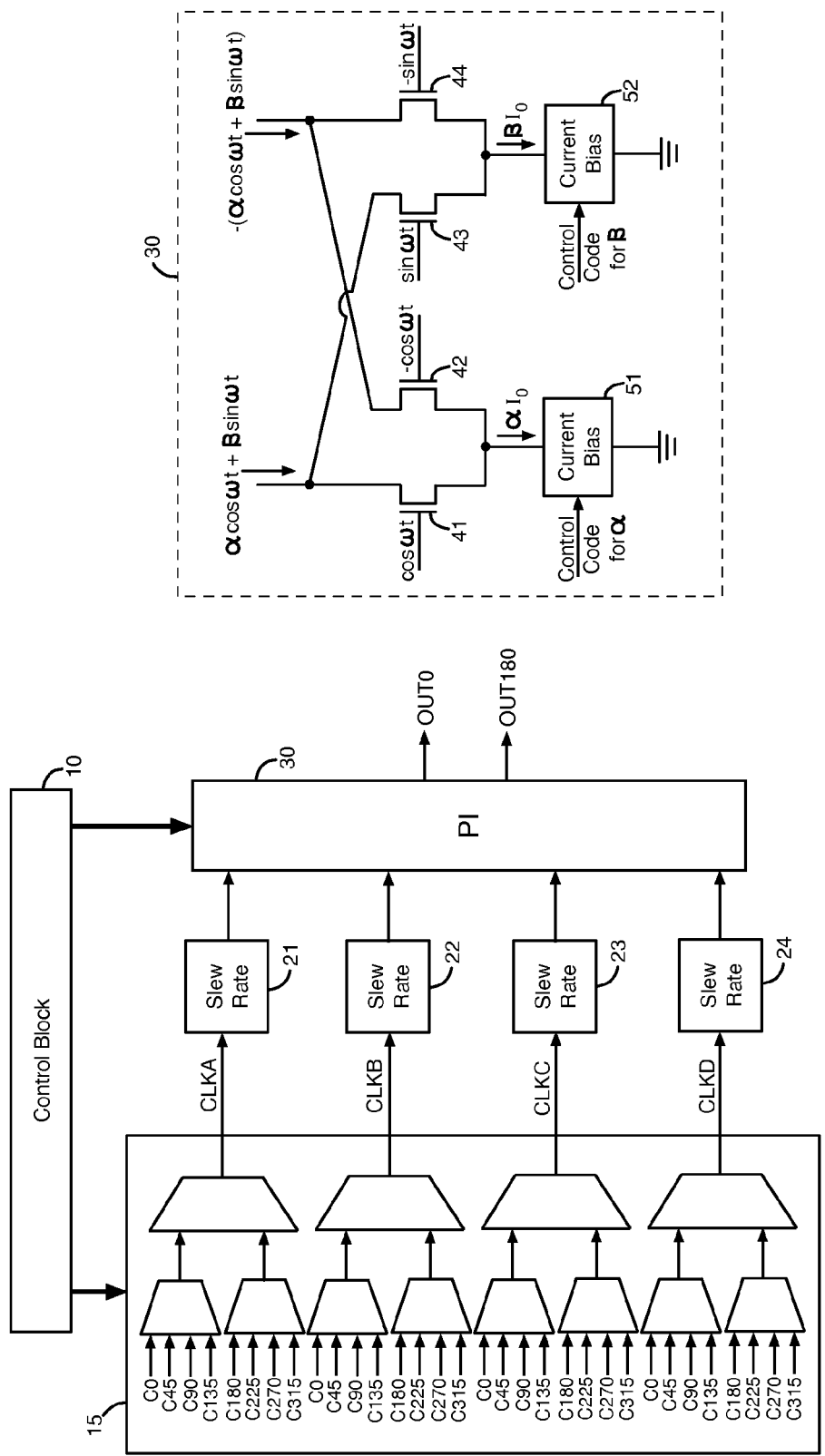
FIG. 1A illustrates a prior art phase interpolator system.
Figure 1B:
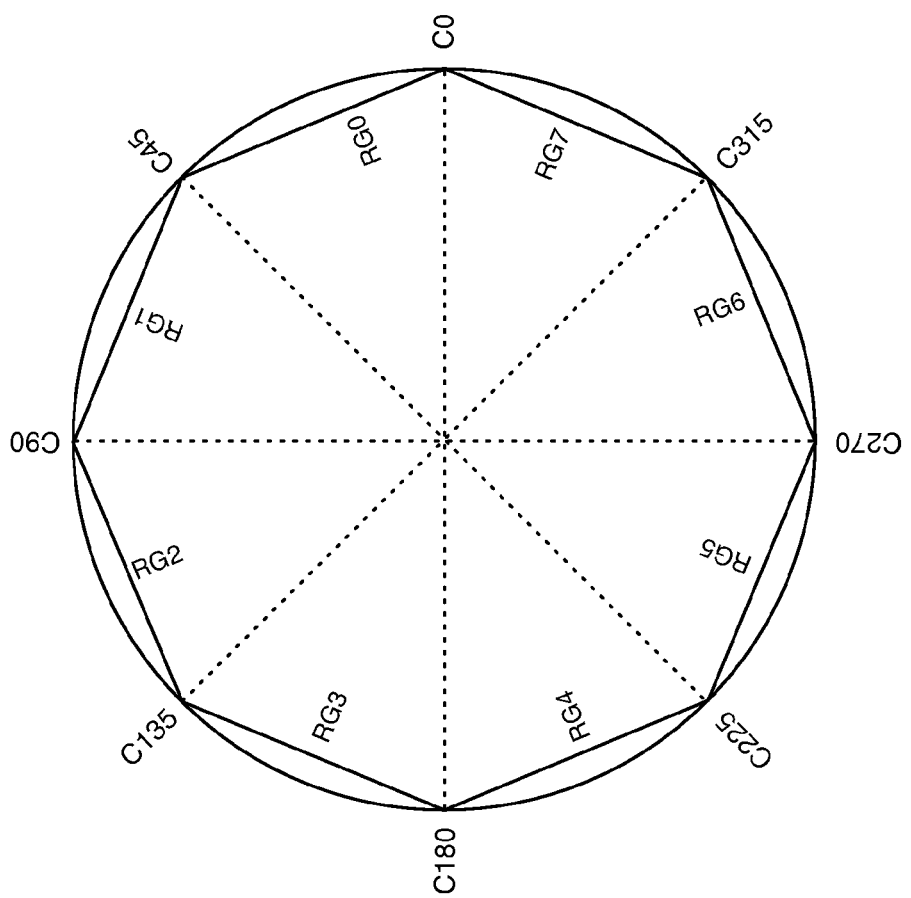
FIG. 1B illustrates the 8 regions RG0-RG7 between 0° and 360°.
Figure 2:
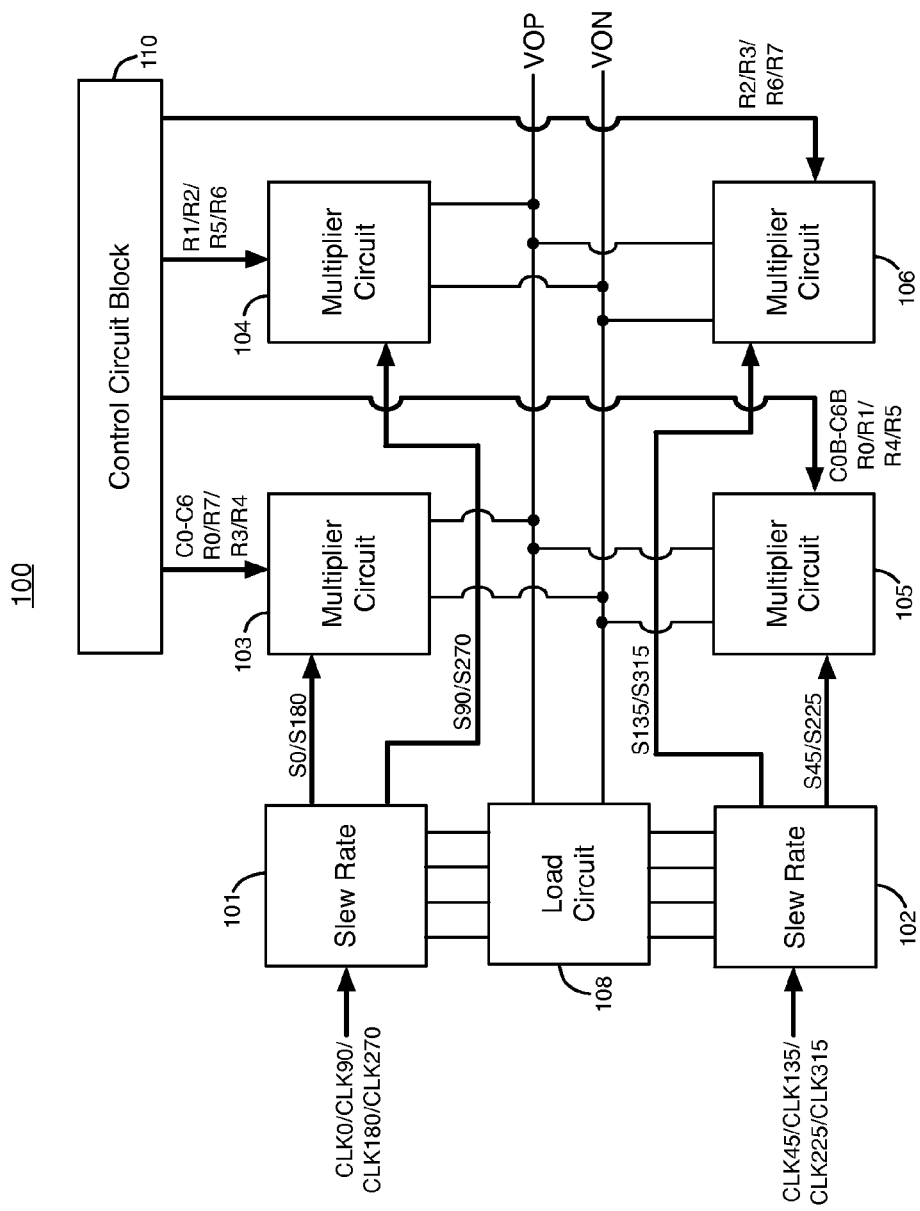
FIG. 2 illustrates an example of a phase interpolator circuit, according to an embodiment of the present invention.

FIG. 2 illustrates an example of a phase interpolator circuit 100, according to an embodiment of the present invention. Phase interpolator circuit 100 includes slew rate circuits 101-102, multiplier circuits 103-106, load circuit 108, and control circuit block 110. Phase interpolator 100 receives 8 digital periodic clock signals CLK0, CLK45, CLK90, CLK135, CLK180, CLK225, CLK270, and CLK315. Each of the clock signals CLK0, CLK45, CLK90, CLK135, CLK180, CLK225, CLK270, and CLK315 is a voltage square wave that has a 50% duty cycle. Clock signals CLK0, CLK45, CLK90, CLK135, CLK180, CLK225, CLK270, and CLK315 are offset in phase at 45° phase intervals. Clock signals CLK0, CLK45, CLK90, CLK135, CLK180, CLK225, CLK270, and CLK315 have relative phases of 0°, 45°, 90°, 135°, 180°, 225°, 270°, and 315°, respectively. These clock signals can be generated by, for example, a voltage-controlled oscillator in a phase-locked loop or a voltage-controlled delay line in a delay-locked loop.

Phase interpolator 100 converts clock signals CLK0, CLK45, CLK90, CLK135, CLK180, CLK225, CLK270, and CLK315 into 8 periodic sinusoidal voltage waveforms S0, S45, S90, S135, S180, S225, S270, and S315. Signals S0, S45, S90, S135, S180, S225, S270, and S315 have relative phases of 0°, 45°, 90°, 135°, 180°, 225°, 270°, and 315°, respectively. Slew rate circuit 101 converts clock signals CLK0, CLK90, CLK180, and CLK270 into voltage signals S0, S90, S180, and S270, respectively. Slew rate circuit 102 converts clock signals CLK45, CLK135, CLK225, and CLK315 into voltage signals S45, S135, S225, and S315, respectively. Voltage signals S0, S45, S90, S135, S180, S225, S270, and S315 are more sinusoidal in shape than the 8 input clock signals.

Sinusoidal voltage signals S0 and S180 are transmitted to inputs of multiplier circuit 103. Sinusoidal voltage signals S90 and S270 are transmitted to inputs of multiplier circuit 104. Sinusoidal voltage signals S45 and S225 are transmitted to inputs of multiplier circuit 105. Sinusoidal voltage signals S135 and S315 are transmitted to inputs of multiplier circuit 106.

Multiplier circuits 103-106 generate a differential sinusoidal output voltage signal waveform VOP/VON that has a selected phase shift relative to clock signal CLK0 in response to 4 of the 8 sinusoidal voltage waveforms S0, S45, S90, S135, S180, S225, S270, and S315. The phase shift of VOP/VON relative to CLK0 can be selected to be any one of 64 different phase shifts. The 64 different phase shifts for VOP/VON are between 0° and 360° relative to the phase of CLK0.

Control circuit block 110 generates 6 digital control signals C0-C6 that control the current through multiplier circuits 103 and 104. Control circuit block 110 also generates 6 digital control signals C0B-C6B that control the current through multiplier circuits 105 and 106. Control signals C0B-C6B are the logical complements of control signals C0-C6, respectively. Control signals C0-C6 are transmitted to multiplier circuit 103, and control signals C0B-C6B are transmitted to multiplier circuit 105. Control circuit block 110 changes the currents through multiplier circuits 103-106 by varying the logic states of control signals C0-C6 and C0B-C6B. Control circuit block 110 varies the phase shift of VOP/VON relative to CLK0 by changing the current through multiplier circuits 103-106. Control circuit block 110 can include, for example, a state machine, a decoder circuit, or a counter circuit.

Control circuit 110 also generates 8 digital switch control signals R0-R7. Switch control signals R0-R7 control the conductive states of switch circuits in multiplier circuits 103-106. Switch control signals R0, R3, R4, and R7 are transmitted to multiplier circuit 103. Switch control signals R1, R2, R5, and R6 are transmitted to multiplier circuit 104. Switch control signals R0, R1, R4, and R5 are transmitted to multiplier circuit 105. Switch control signals R2, R3, R6, and R7 are transmitted to multiplier circuit 106.

The logic states of control signals C0-C6, C0B-C6B, and R0-R7 determine the phase shift between output voltage signal VOP/VON and input clock signal CLK0. Control circuit block 110 changes the logic states of one of control signals C0-C6 or R0-R7 to vary the phase shift between output voltage signal VOP/VON and CLK0. Phase interpolator 100 can generate any one of 64 different phase shifts between VOP/VON and CLK0 that occur at phase intervals between 0° and 360°.

Load circuit 108 provides a resistive load for slew rate circuits 101-102 and for multiplier circuits 103-106. Load circuit 108 can contain, for example, passive resistors or field-effect transistors that are configured to have constant drain-to-source resistance values, as described in more detail below.

Figure 3:
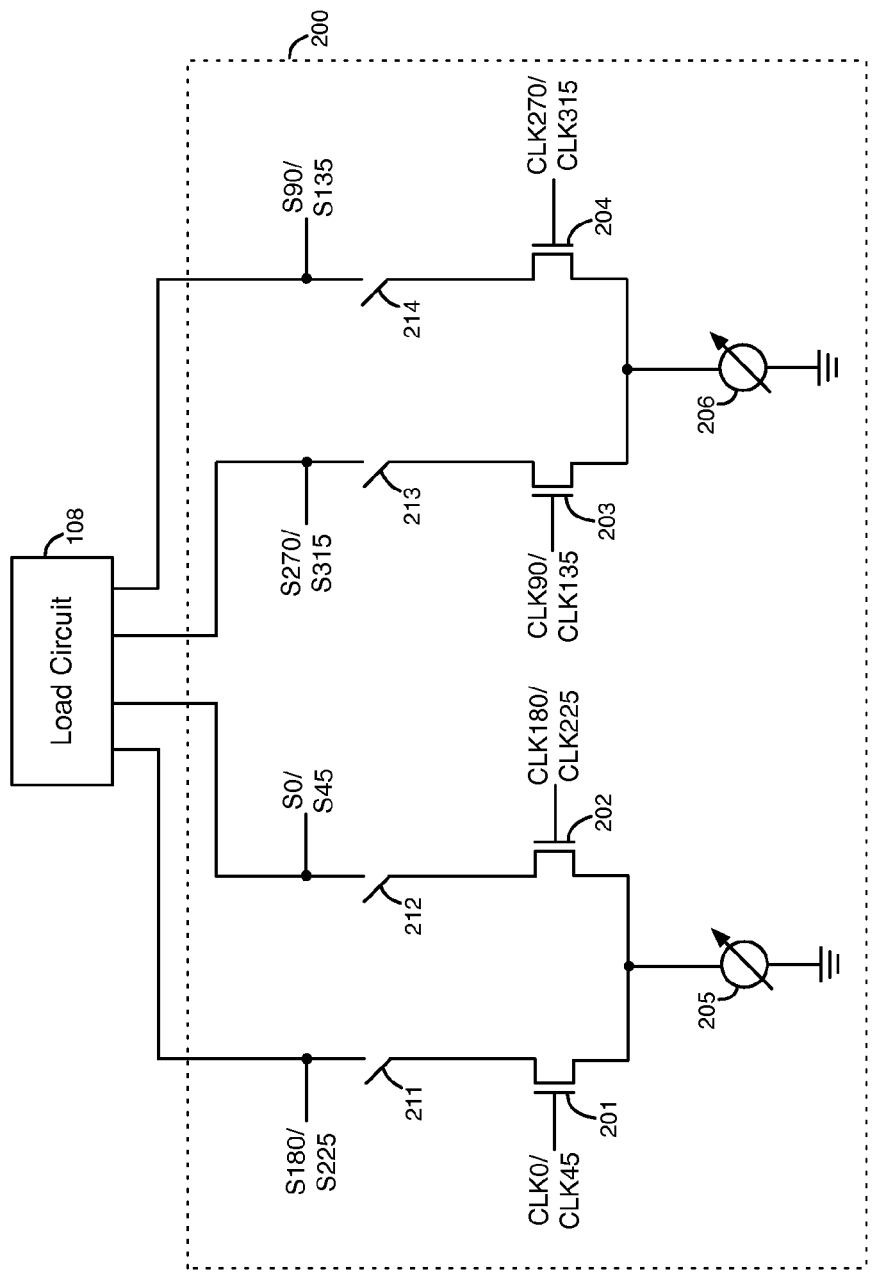
FIG. 3 illustrates an example of a slew rate circuit, according to an embodiment of the present invention.

FIG. 3 illustrates an example of a slew rate circuit 200, according to an embodiment of the present invention. Slew rate circuit 200 is an example of the circuitry in slew rate circuit 101. Slew rate circuit 200 is also an example of the circuitry in slew rate circuit 102.

Slew rate circuit 200 includes n-channel metal oxide semiconductor field-effect transistors (MOSFETs) 201-204, variable current sources 205-206, and switch circuits 211-214. Transistors 201-202 form a first differential pair that receives bias current from variable current source 205. Transistors 203-204 form a second differential pair that receives bias current from variable current source 206. Switches 211-214 are always closed and are not open during the operation of phase interpolator 100. Switches 211-214 are added to match switches in multiplier circuits 103-106. The drains of transistors 201-204 are coupled to shared load resistors or shared active load transistors in load circuit 108 through switches 211-214, respectively.

In slew rate circuit 101, differential pair transistors 201-202 convert voltage square wave clock signals CLK0 and CLK180 into sinusoidal voltage signals S0 and S180, and differential pair transistors 203-204 convert voltage square wave clock signals CLK90 and CLK270 into sinusoidal voltage signals S90 and S270. In slew rate circuit 102, differential pair transistors 201-202 convert voltage square wave clock signals CLK45 and CLK225 into sinusoidal voltage signals S45 and S225, and differential pair transistors 203-204 convert voltage square wave clock signals CLK135 and CLK315 into sinusoidal voltage signals S135 and S315.

Figure 4A:
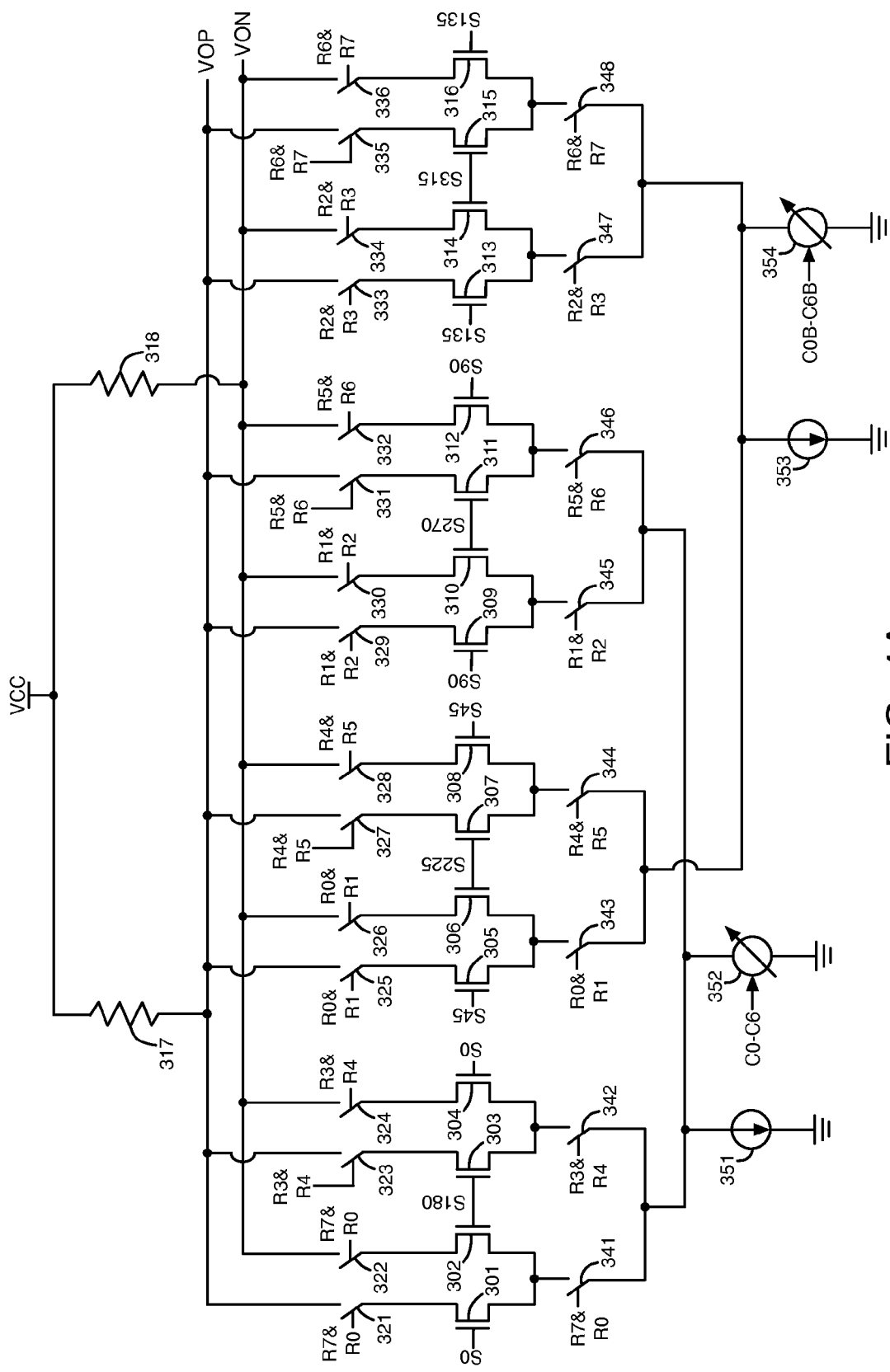
FIG. 4A illustrates an example of multiplier circuits in the phase interpolator of FIG. 2, according to an embodiment of the present invention.

FIG. 4A illustrates an example of multiplier circuits 103-106, according to an embodiment of the present invention. Multiplier circuit 103 includes n-channel MOSFETs 301-304, switch circuits 321-324 and 341-342, constant current source 351, and variable current source 352. Multiplier circuit 105 includes n-channel MOSFETs 305-308, switch circuits 325-328 and 343-344, constant current source 353, and variable current source 354. Multiplier circuit 104 includes n-channel MOSFETs 309-312, switch circuits 329-332, and switch circuits 345-346. Multiplier circuit 106 includes n-channel MOSFETs 313-316, switch circuits 333-336, and switch circuits 347-348. Load resistors 317 and 318 are part of load circuit 108 in FIG. 2. Load resistors 317-318 are passive resistors.

Figure 4B:
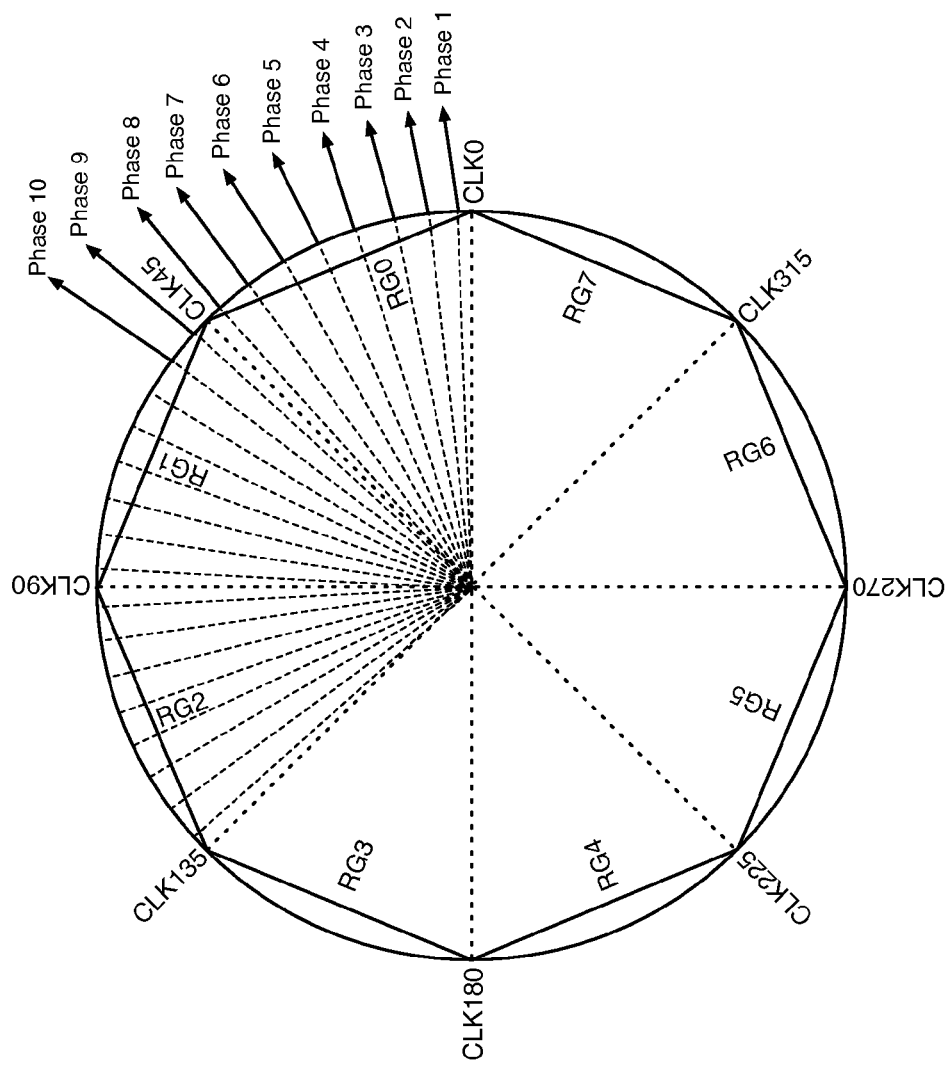
FIG. 4B is a rotator diagram that illustrates the 64 possible phases from 0° and 360° in an output signal of the phase interpolator of FIG. 2, according to an embodiment of the present invention.

The logic states of switch control signals R0-R7 and current control signals C0-C6 and C0B-C6B determine the phase shift between the output voltage VOP/VON of phase interpolator 100 and CLK0. FIG. 4B is a rotator diagram that illustrates the 64 possible phase shifts between VOP/VON and CLK0 from 0° and 360°, according to an embodiment of the present invention. The rotator diagram of FIG. 4B includes 8 different regions. Each of the 8 regions includes a 45° slice of a 360° circle. The 8 regions are labeled RG0-RG7 in FIG. 4B.

The phase shift between VOP/VON and CLK0 is an angle within one of the 8 regions RG0-RG7. Multiplier circuits 103-106 generate a phase shift in VOP/VON relative to CLK0 within one of the 8 regions. The logic states of switch control signals R0-R7 determine which of the 8 regions the phase shift in VOP/VON is generated in.

Digital switch control signals R0-R7 control the conductive states of switch circuits 321-336 and 341-348, as shown in FIG. 4A. Each of the switch circuits 321-336 and 341-348 is controlled by two of the switch control signals R0-R7. When both of the switch control signals R0-R7 that control a particular one of the switch circuits 321-336 and 341-348 are in logic high states, the switch circuit controlled by those two switch control signals is closed (i.e., allows current flow). When at least one of the switch control signals R0-R7 that controls a particular one of the switch circuits 321-336 and 341-348 is in a logic low state, that switch circuit is open (i.e., blocks current flow). Each of the switch circuits 321-336 and 341-348 can, for example, include a logic AND gate having inputs that receive two of the switch control signals R0-R7 and an output that drives a pass gate.

Switch circuits 321, 323, 325, 327, 329, 331, 333 and 335 couple or decouple transistors 301, 303, 305, 307, 309, 311, 313, and 315, respectively, to or from load resistor 317. Switch circuits 322, 324, 326, 328, 330, 332, 334 and 336 couple or decouple transistors 302, 304, 306, 308, 310, 312, 314, and 316, respectively, to or from load resistor 318. Switch circuits 341-348 couple or decouple transistors 301-316 with current sources 351-354. The circuitry of FIG. 4A includes 8 differential pairs of transistors formed by transistors 301-302, transistors 303-304, transistors 305-306, transistors 307-308, transistors 309-310, transistors 311-312, transistors 313-314, and transistors 315-316.

At any one time, only 3 of the switch control signals R0-R7 are in logic high states, and the remaining 5 switch control signals R0-R7 are in logic low states. The 3 switch control signals R0-R7 that are in logic high states cause the switch circuits to couple only two of the 8 differential pairs of transistors in FIG. 4A to load resistors 317-318 and to current sources 351-354. The remaining 5 switch control signals R0-R7 that are in logic low states cause the switch circuits to decouple the other 6 differential pairs from load resistors 317-318 and from current sources 351-354. As a result, only two of the differential pairs of transistors formed by transistors 301-316 are on at any one time to generate output voltage VOP/VON, and the other 6 differential pairs of transistors are off.

The three switch control signals R0-R7 that are in logic high states select the region of operation for the phase of VOP/VON. For example, when switch control signals R0, R1, and R7 are in logic high states, and switch control signals R2-R6 are in logic low states, switches 321-322, 325-326, 341, and 343 are closed (i.e., conduct current), the remaining switches in FIG. 4A are open (i.e., in non-conductive states), and differential pairs 301-302 and 305-306 generate differential output voltage VOP/VON in response to sinusoidal input signals S0, S45, and their complementary signals S180 and S225. Phase interpolator 100 generates phase shifts in VOP/VON within region RG0 between 0° and 45°.

When switch control signals R0, R1, and R2 are in logic high states, and switch control signals R3-R7 are in logic low states, switches 325-326, 329-330, 343, and 345 are closed, the remaining switches in FIG. 4A are open, and differential pairs 305-306 and 309-310 generate differential output voltage VOP/VON in response to sinusoidal input signals S45, S90, and their complementary signals S225, and S270. Phase interpolator 100 generates phase shifts in VOP/VON within region RG1 between 45° and 90°.

When switch control signals R1, R2, and R3 are in logic high states, and switch control signals R0 and R4-R7 are in logic low states, switches 329-330, 333-334, 345, and 347 are closed, the remaining switches in FIG. 4A are open, and differential pairs 309-310 and 313-314 generate differential output voltage VOP/VON in response to sinusoidal input signals S90, S135, and their complementary signals S270 and S315. Phase interpolator 100 generates phase shifts in VOP/VON within region RG2 between 90° and 135°.

When switch control signals R2, R3, and R4 are in logic high states, and switch control signals R0-R1 and R5-R7 are in logic low states, switches 333-334, 323-324, 347, and 342 are closed, the remaining switches in FIG. 4A are open, and differential pairs 313-314 and 303-304 generate differential output voltage VOP/VON in response to sinusoidal input signals S135, S180, and their complementary signals S315 and S0. Phase interpolator 100 generates phase shifts in VOP/VON within region RG3 between 135° and 180°.

When switch control signals R3, R4, and R5 are in logic high states, and switch control signals R0-R2 and R6-R7 are in logic low states, switches 323-324, 342, 327-328, and 344 are closed, the remaining switches in FIG. 4A are open, and differential pairs 303-304 and 307-308 generate differential output voltage VOP/VON in response to sinusoidal input signals S180, S225, and their complementary signals S0 and S45. Phase interpolator 100 generates phase shifts in VOP/VON within region RG4 between 180° and 225°.

When switch control signals R4, R5, and R6 are in logic high states, and switch control signals R0-R3 and R7 are in logic low states, switches 327-328, 344, 331-332, and 346 are closed, the remaining switches in FIG. 4A are open, and differential pairs 307-308 and 311-312 generate differential output voltage VOP/VON in response to sinusoidal input signals S225, S270, and their complementary signals S45 and S90. Phase interpolator 100 generates phase shifts in VOP/VON within region RG5 between 225° and 270°.

When switch control signals R5, R6, and R7 are in logic high states, and switch control signals R0-R4 are in logic low states, switches 331-332, 346, 335-336, and 348 are closed, the remaining switches in FIG. 4A are open, and differential pairs 311-312 and 315-316 generate differential output voltage VOP/VON in response to sinusoidal input signals S270, S315, and their complementary signals S90 and S135. Phase interpolator 100 generates phase shifts in VOP/VON within region RG6 between 270° and 315°.

When switch control signals R6, R7, and R0 are in logic high states, and switch control signals R1-R5 are in logic low states, switches 335-336, 348, 321-322, and 341 are closed, the remaining switches in FIG. 4A are open, and differential pairs 315-316 and 301-302 generate differential output voltage VOP/VON in response to sinusoidal input signals S315, S0, and their complementary signals S135 and S180. Phase interpolator 100 generates phase shifts in VOP/VON within region RG7 between 315° and 360°.

Table 2 below summaries the 4 sinusoidal input signals that are used to generate VOP/VON in each of the 8 regions of FIG. 4B.

TABLE 2

| Region | RG0 | RG1 | RG2 | RG3 | RG4 | RG5 | RG6 | RG7 |
|---|---|---|---|---|---|---|---|---|
| cosωt | S0 | S45 | S90 | S135 | S180 | S225 | S270 | S315 |
| −cosωt | S180 | S225 | S270 | S315 | S0 | S45 | S90 | S135 |
| sinωt | S45 | S90 | S135 | S180 | S225 | S270 | S315 | S0 |
| −sinωt | S225 | S270 | S315 | S0 | S45 | S90 | S135 | S180 |

Only one differential pair of transistors 301-304, 309-312 receives bias current from current sources 351-352 at a time, and only one differential pair of transistors 305-308, 313-316 receives bias current from current sources 353-354 at a time. Phase interpolator 100 uses different combinations of the periodic sinusoidal input signals S0, S45, S90, S135, S180, S225, S270, and S315 to generate VOP/VON by changing the conductive states of switches 321-336 and 341-348 to turn on only two selected differential pairs of transistors 301-316 at a time. Phase interpolator 100 can generate phases in VOP/VON within any of the 8 different regions RG0-RG7 by turning on two selected differential pairs of the transistors 301-316 at any one time. The other six differential pairs of transistors are decoupled from the outputs at VOP/VON and from current sources 351-354.

Periodic input signals S0, S45, S90, S135, S180, S225, S270, and S315 are concurrently provided to the gates of transistors 301-316 at all times during the operation of phase interpolator 100, as shown in FIG. 4A. Because switches 321-336 and 341-348 decouple the six differential pairs of transistors that are not being used from the outputs at VOP/VON and from the current sources 351-354, phase interpolator 100 reduces charge coupling to output voltage VOP/VON from the periodic input signals that are not being used to generate VOP/VON. As a result, phase interpolator 100 reduces jitter in VOP/VON. Phase interpolator 100 also reduces power and area relative to a system that selects 4 clock signals among several different input clock signals and provides only the 4 selected clock signals to inputs of a single multiplier circuit.

The logic states of digital control signals C0-C6 determine the current through variable current source 352. The logic states of digital control signals C0B-C6B determine the current through variable current source 354.

Figure 5:
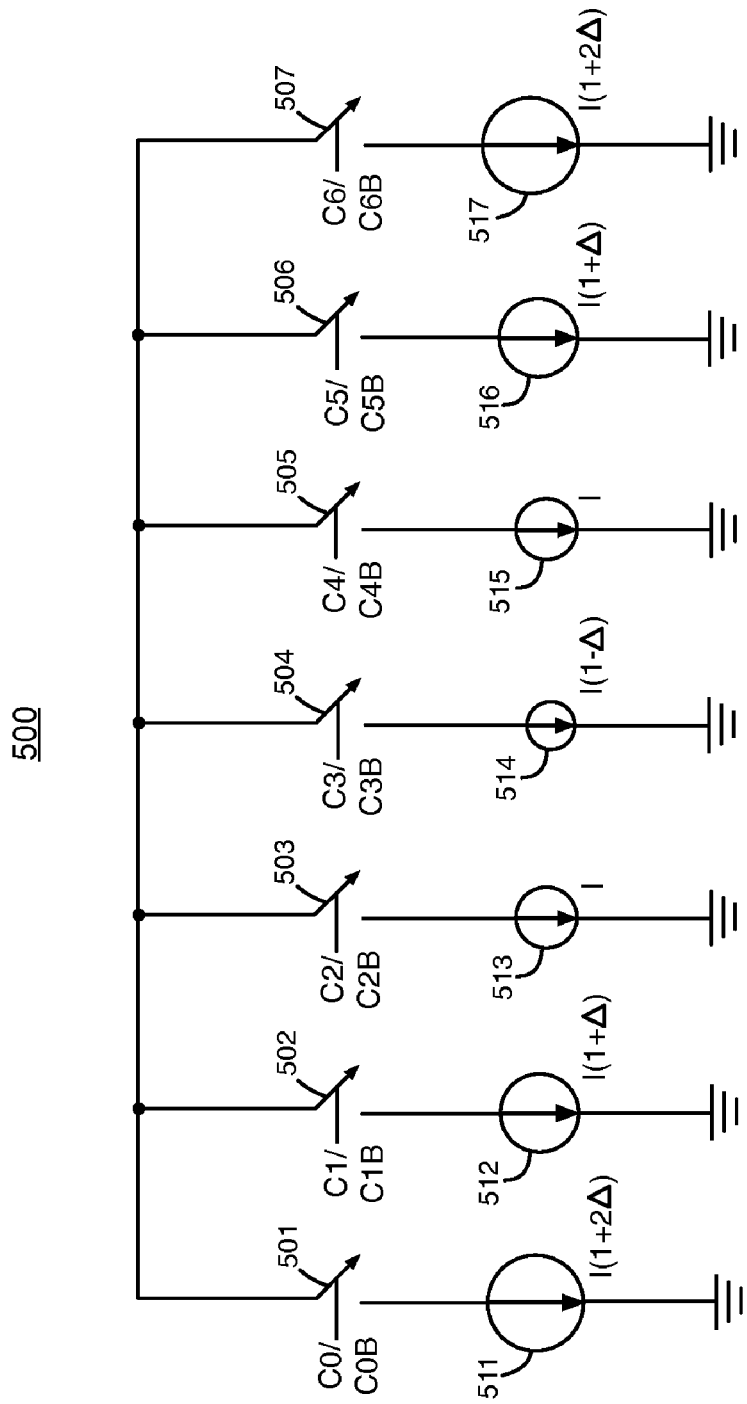
FIG. 5 illustrates an example of a variable current source, according to an embodiment of the present invention.

FIG. 5 illustrates an example of a variable current source 500, according to an embodiment of the present invention. Variable current source 500 is an example of variable current source 352. Variable current source 500 is also an example of variable current source 354. Variable current source 500 includes switch circuits 501-507 and current sources 511-517.

Switch circuits 501-507 are coupled in series with current sources 511-517, respectively, as shown in FIG. 5. In current source 352, current control signals C0-C6 control the conductive states of switch circuits 501-507, respectively. In current source 354, current control signals C0B-C6B control the conductive states of switch circuits 501-507, respectively. The current through variable current source 500 changes based on changes in the logic states of the current control signals C0-C6 or C0B-C6B.

A switch circuit 501-507 in current source 500 is closed (i.e., conductive) when a respective one of the current control signals C0-C6 or C0B-C6B is in a logic high state. A switch circuit 501-507 in current source 500 is open (i.e., non-conductive) when a respective one of the current control signals C0-C6 or C0B-C6B is in a logic low state.

The logic states of current control signals C0-C6 are varied to generate 8 different current settings for variable current source 352. The logic states of current control signals C0B-C6B are varied to generate 8 different current settings for variable current source 354.

Because current control signals C0B-C6B are the logic complements (i.e., logical inverses) of current control signals C0-C6, respectively, when the current through variable current source 352 increases, the current through variable current source 354 decreases by the same amount of current. Also, when the current through variable current source 354 increases, the current through variable current source 352 decreases by the same amount of current.

Each current setting for variable current source 352 corresponds to only one of the current settings for variable current source 354. Current control signals C0-C6 and C0B-C6B are thermometer-encoded. Thus, the 8 different current settings of variable current sources 352 and 354 are generated by current control signals C0-C6 and C0B-C6B having the following 8 logical values, respectively, 0000000 and 1111111, 1000000 and 0111111, 1100000 and 0011111, 1110000 and 0001111, 1111000 and 0000111, 1111100 and 0000011, 1111110 and 0000001, and 1111111 and 0000000. Constant current source 351 provides a minimum bias current when the current through variable current source 352 is zero. Constant current source 353 provides a minimum bias current when the current through variable current source 354 is zero.

The 8 different current settings of variable current sources 352 and 354 generate 8 different phases in VOP/VON when phase interpolator 100 is functioning within each of the 8 regions RG0-RG7. For example, the 8 current settings of variable current sources 352 and 354 generate phase 1, phase 2, phase 3, phase 4, phase 5, phase 6, phase 7, and phase 8 in VOP/VON between 0° and 45° within region RG0, as shown in FIG. 4B, when switch control signals R0, R1, and R7 are in logic high states. The 8 current settings of variable current sources 352 and 354 also generate 8 unique phases in VOP/VON when phase interpolator 100 is operating in each of the other 7 regions RG1-RG7. As a result, phase interpolator 100 can generate 64 unique phases in VOP/VON between 0° and 360°.

When phase interpolator 100 transitions from one of the regions RG0-RG7 to another one of the regions, current control signals C0-C6 and C0B-C6B cause the currents through variable current sources 352 and 354 to remain constant. Phase interpolator 100 causes the polarity of only one of the input phases to be switched at a time to increase the stability of VOP/VON and to reduce jitter in VOP/VON.

In one embodiment, each of the current sources in variable current sources 352 and 354 generates the same amount of current. Also in this embodiment, current source 351 generates one-half the current through each one of the current sources within 352, and current source 353 generates one-half the current through each one of the current sources within 354. In this embodiment, the angles between adjacent pairs of phases in VOP/VON vary across each region of the rotator diagram of FIG. 4B. The angles between phases near the middle of each of the regions RG0-RG7 are larger than the angles between phases near the boundaries of each of the regions. For example, the angle between phases 4 and 5 is larger than the angle between phases 1 and 2 in FIG. 4B.

In another alternative embodiment, current sources 511-517 in variable current sources 352 and 354 generate non-uniform relative currents of I(1+2Δ), I(1+Δ), I, I(1−Δ), I, I(1+Δ), and I(1+2Δ), respectively, as shown in FIG. 5. I represents a first current value. Δ represents a second current value that is dependent on the phase shift θ in output signal VOP/VON, as shown below in equation (6). In this embodiment, current sources 511-517 are added to the total current of variable current source 500 to increase the phase shift in VOP/VON in increasing numerical order from 511 to 517. Current sources 511 and 517 generating the largest currents are switched in and out near the boundaries of the regions RG0-RG7. Current source 514, which generates the smallest current, is switched in and out near the center of each region. This embodiment improves the linearity of phase interpolator 100 at low frequency operation. This embodiment also causes the angles between adjacent phases in VOP/VON to be closer to the same value across each region R0-RG7 and between regions R0-R7.

The transfer function of phase interpolator 100 is represented by the equations below in the embodiment in which variable current sources 352 and 354 include the non-uniform current sources 511-517 of FIG. 5.

$$V_{out}=f(\alpha)\times\sin(\omega t)+f(\beta)\times\cos(\omega t)=c(\alpha,\beta)\times\sin(\omega t+\theta) \quad (4)$$

$$\theta=\arctan(f(\beta)/f(\alpha)) \quad (5)$$

$$f(\beta)/f(\alpha)=\tan(\theta)=f(\theta)=\Delta \quad (6)$$

In equation (4), $V_{OUT}$=VOP/VON. In equation (5), arctan refers to the arctangent function, which is the inverse of the tangent function. In equation (6) tan refers to the tangent function. The target phase for $V_{OUT}$ can be obtained by controlling the two coefficients of equation (4) complementarily, as shown in equation (7).

$$f(\beta)+f(\alpha)=1 \quad (7)$$

Equations (8) and (9) below are obtained from equations (6) and (7), where cot refers to the cotangent function. In equations (4)-(9), $0 \leq f(\beta) \leq 1$, and $0 \leq \theta \leq \pi/4$.

$$f(\beta) = \frac{1}{1+\cot(\theta)} \quad (8)$$

$$f(\alpha) = \frac{\cot(\theta)}{1+\cot(\theta)} \quad (9)$$

Figure 6:
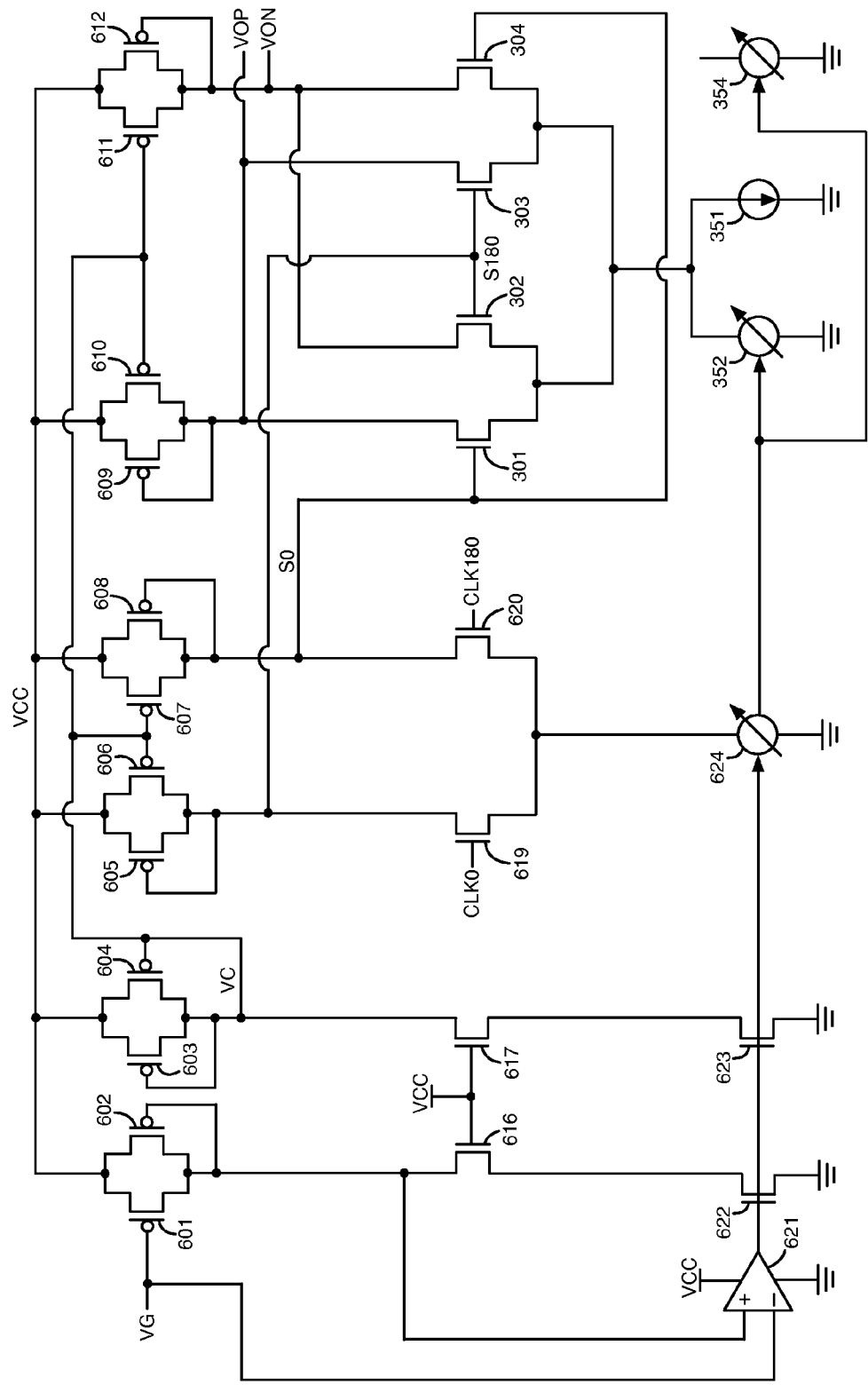
FIG. 6 illustrates a portion of a phase interpolator circuit having active load transistors and slew rate circuits with adjustable current sources, according to an embodiment of the present invention.

FIG. 6 illustrates a portion of phase interpolator circuit 100 having active load transistors and slew rate circuits with adjustable current sources, according to an embodiment of the present invention. FIG. 6 illustrates a portion of slew rate block 101 and a portion of multiplier circuit 103. P-channel MOSFETs 605-608, n-channel MOSFETs 619-620, and variable current source 624 are part of slew rate block 101. P-channel MOSFETs 605-608 function as active load resistors for differential pair transistors 619-620. In this embodiment, differential transistor pairs in the other 3 slew rate circuits in slew rate blocks 101-102 are coupled to the same active load transistors 605-608.

P-channel MOSFETs 609-612, n-channel MOSFETs 301-304, and current sources 351-352 are part of multiplier circuit 103. The switches in multiplier circuit 103 are not shown in FIG. 6. P-channel MOSFETs 609-612 function as active load resistors for differential pairs 301-302 and 303-304. Transistors 609-612 replace passive resistors 317-318 in the embodiment of FIG. 6. In this embodiment, transistors 305-316 in multiplier circuits 104-106 are coupled to the same active load transistors 609-612.

FIG. 6 also includes a replica bias circuit that controls the currents of variable current sources 624, 352, and 354. The replica bias circuit also controls the drain-to-source resistances of p-channel load transistors 605-612. The replica bias circuit includes p-channel transistors 601-604, n-channel transistors 616-617 and 622-623, and amplifier circuit 621.

A constant reference voltage VG is transmitted to the gate of transistor 601 and to the inverting input of amplifier 621. Amplifier 621 drives the gate voltages of transistors 622-623 based on the difference between reference voltage VG and the voltage at the drain of transistor 616. The output voltage of amplifier 621 also affects the current of variable current sources 624, 352, and 354. Variable current source 624 provides bias current to differential pair transistors 619-620.

The output voltage VOP/VON of phase interpolator 100 can be used to sample an input data signal. If the date rate of the input data signal changes, voltage VG is adjusted to change the currents through variable current sources 624, 352, and 354. The currents through variable current sources 624, 352, and 354 can be adjusted in response to a change in the data rate to ensure that phase interpolator 100 generates the same or nearly the same phase shifts in VOP/VON over a range of frequencies. Amplifier 621 can adjust the currents through variable current sources 352 and 354, for example, by adjusting the currents through current sources 511-517.

The voltage VC between transistors 604 and 617 drives the gates of transistors 604, 606-607, and 610-611. Transistors 602, 603, 605, 608, 609, and 612 are diode-connected. The replica bias circuit causes voltage VC to be nominally equal to VG. Voltage VC remains stable over variations in the process, the supply voltage VCC, and the temperature (PVT) of the integrated circuit that phase interpolator 100 is fabricated on. As a result, the drain-to-source resistances of transistors 606-607 and 610-611 have a low sensitivity to supply voltage noise (i.e., the resistance of the loads 606-607 is symmetric about the crossing of the differential outputs).

Figure 7:
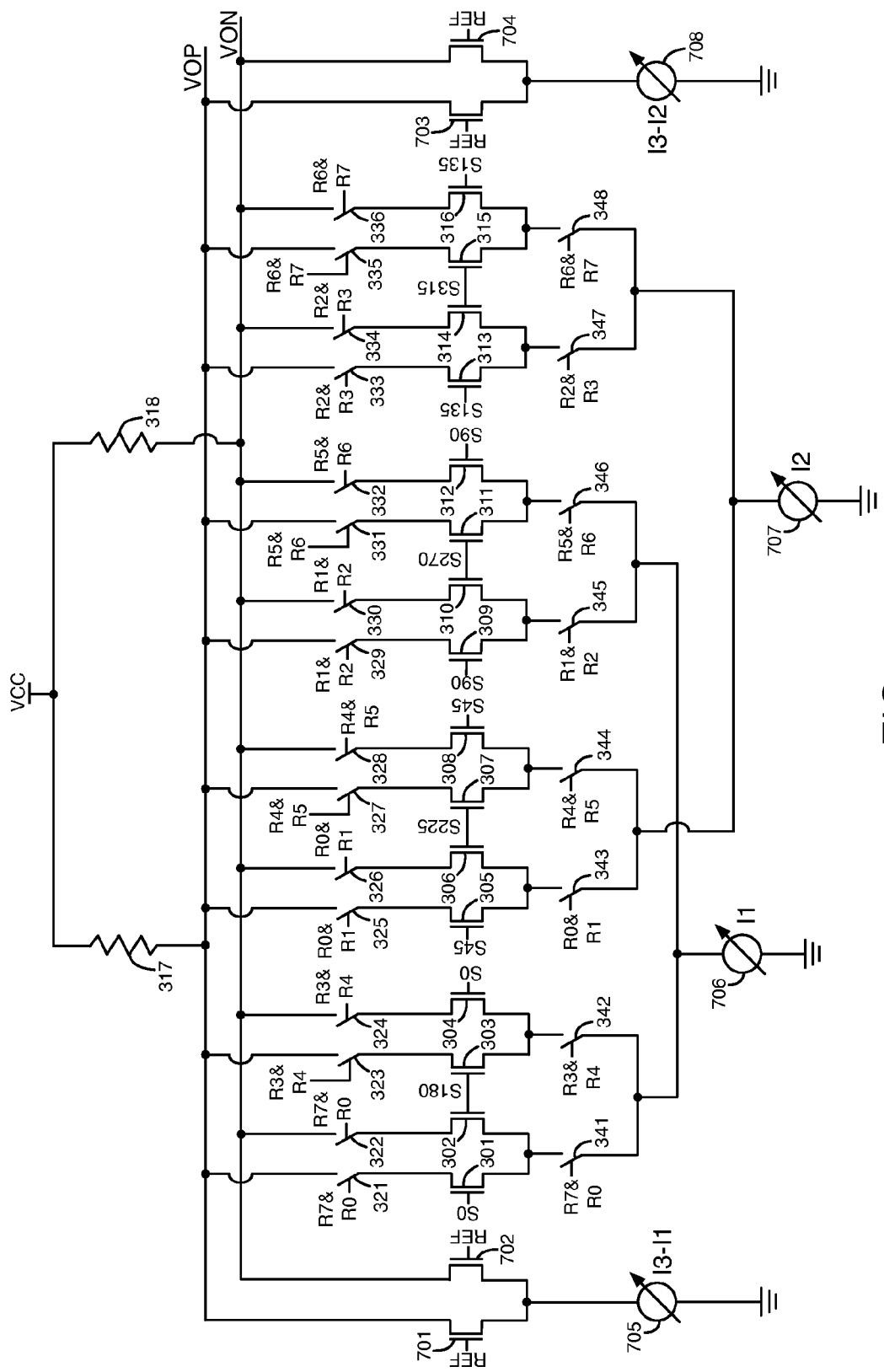
FIG. 7 illustrates another example of multiplier circuits that can be used in the phase interpolator of FIG. 2, according to an alternative embodiment of the present invention.

FIG. 7 illustrates another example of multiplier circuits 103-106, according to an alternative embodiment of the present invention. The embodiment of FIG. 7 includes 4 additional n-channel MOSFETs 701-704. Transistors 701-702 are a differential pair that is coupled between load resistors 317-318 and variable current source 705. Transistors 703-704 are a differential pair that is coupled between load resistors 317-318 and variable current source 708. The sources of transistors 301-304 and 309-312 are coupled to variable current source 706 and the sources of transistors 305-308 and 313-316 are coupled to variable current source 707 when the corresponding switches 341-348 are closed.

A constant reference voltage REF is provided to the gates of transistors 701-704. The extra transistors 701-704 have been added to the multiplier circuits to keep the DC current levels through load resistors 317 and 318 independent of the sinusoidal input signals. Transistors 701-704 cause the output junction capacitance of phase interpolator 100 at VOP/VON to be less sensitive to the sinusoidal input signals. The circuitry of FIG. 7 generates a more constant peak-to-peak amplitude in VOP/VON relative to the circuitry of FIG. 4A. As a result, the transfer function of phase interpolator 100 is more linear at high frequencies when phase interpolator 100 includes the circuitry of FIG. 7. The two extra differential pairs formed by transistors 701-704 also function as dummy branches that improve matching for phase interpolator 100.

In the embodiment of FIG. 7, variable current sources 706 and 707 generate variable currents I1 and I2, respectively. The currents through variable current sources 706 and 707 are adjusted to change the phase of VOP/VON within a selected region, as described above with respect to FIG. 4A. The current through variable current source 705 equals I3-I1, and the current through variable current source 708 equals I3-I2. I3 represents a fixed current value. Thus, changes in the currents through variable current sources 705 and 708 are inversely related to changes in the currents I1 and I2 through variable current sources 706 and 707, respectively.

Figure 8:
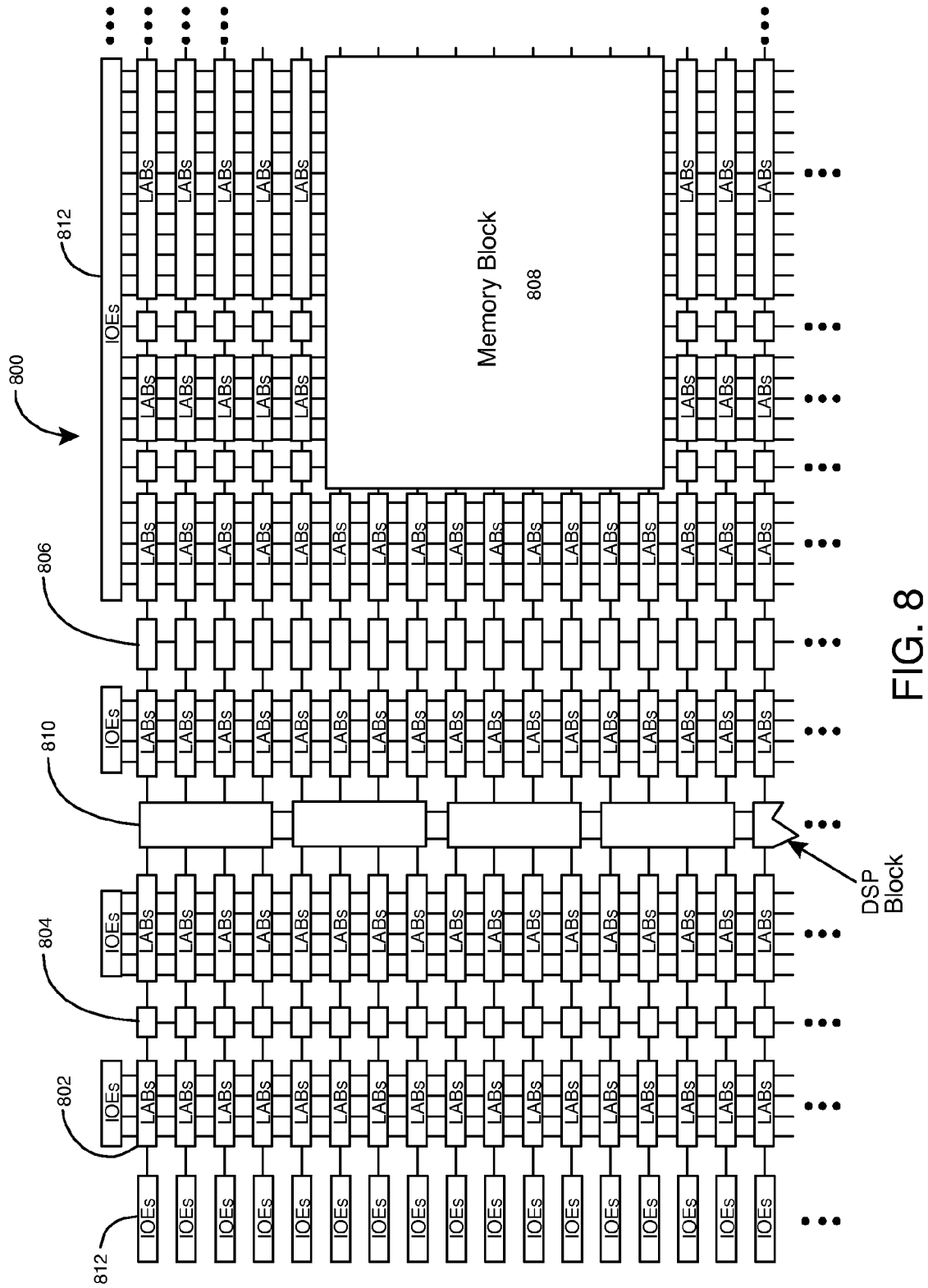
FIG. 8 is a simplified partial block diagram of a field programmable gate array (FPGA) that can include aspects of the present invention.

FIG. 8 is a simplified partial block diagram of a field programmable gate array (FPGA) 800 that can include aspects of the present invention. FPGA 800 is merely one example of an integrated circuit that can include features of the present invention. It should be understood that embodiments of the present invention can be used in numerous types of integrated circuits such as field programmable gate arrays (FPGAs), programmable logic devices (PLDs), complex programmable logic devices (CPLDs), programmable logic arrays (PLAs), application specific integrated circuits (ASICs), memory integrated circuits, central processing units, microprocessors, analog integrated circuits, etc.

FPGA 800 includes a two-dimensional array of programmable logic array blocks (or LABs) 802 that are interconnected by a network of column and row interconnect conductors of varying length and speed. LABs 802 include multiple (e.g., 10) logic elements (or LEs).

An LE is a programmable logic circuit block that provides for efficient implementation of user defined logic functions. An FPGA has numerous logic elements that can be configured to implement various combinatorial and sequential functions. The logic elements have access to a programmable interconnect structure. The programmable interconnect structure can be programmed to interconnect the logic elements in almost any desired configuration.

FPGA 800 also includes a distributed memory structure including random access memory (RAM) blocks of varying sizes provided throughout the array. The RAM blocks include, for example, blocks 804, blocks 806, and block 808. These memory blocks can also include shift registers and first-in-first-out (FIFO) buffers.

FPGA 800 further includes digital signal processing (DSP) blocks 810 that can implement, for example, multipliers with add or subtract features. Input/output elements (IOEs) 812 located, in this example, around the periphery of the chip, support numerous single-ended and differential input/output standards. IOEs 812 include input and output buffers that are coupled to pads of the integrated circuit. The pads are external terminals of the FPGA die that can be used to route, for example, input signals, output signals, and supply voltages between the FPGA and one or more external devices. It is to be understood that FPGA 800 is described herein for illustrative purposes only and that the present invention can be implemented in many different types of integrated circuits.

Figure 9:
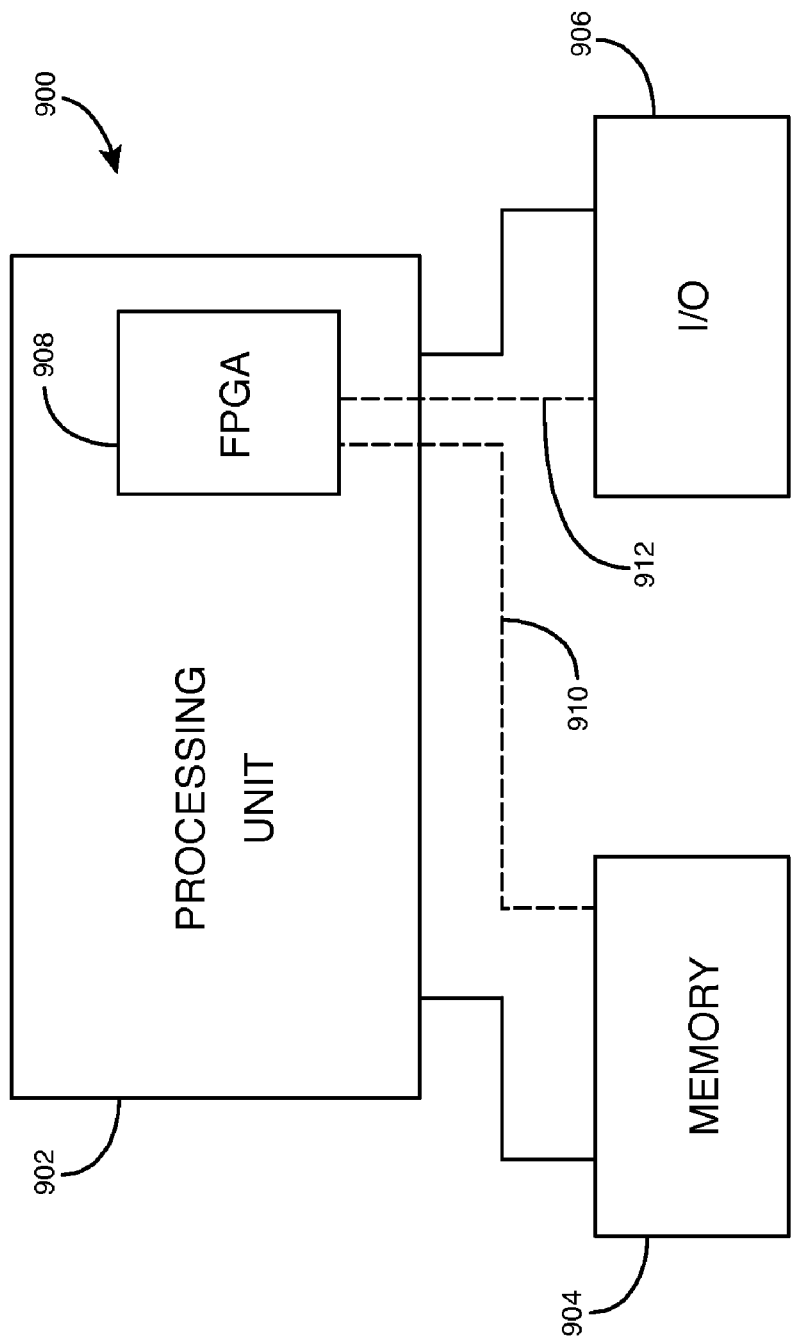
FIG. 9 shows a block diagram of an exemplary digital system that can embody techniques of the present invention.

The present invention can also be implemented in a system that has an FPGA as one of several components. FIG. 9 shows a block diagram of an exemplary digital system 900 that can embody techniques of the present invention. System 900 can be a programmed digital computer system, digital signal processing system, specialized digital switching network, or other processing system. Moreover, such systems can be designed for a wide variety of applications such as telecommunications systems, automotive systems, control systems, consumer electronics, personal computers, Internet communications and networking, and others. Further, system 900 can be provided on a single board, on multiple boards, or within multiple enclosures.

System 900 includes a processing unit 902, a memory unit 904, and an input/output (I/O) unit 906 interconnected together by one or more buses. According to this exemplary embodiment, an FPGA 908 is embedded in processing unit 902. FPGA 908 can serve many different purposes within the system of FIG. 9. FPGA 908 can, for example, be a logical building block of processing unit 902, supporting its internal and external operations. FPGA 908 is programmed to implement the logical functions necessary to carry on its particular role in system operation. FPGA 908 can be specially coupled to memory 904 through connection 910 and to I/O unit 906 through connection 912.

Processing unit 902 can direct data to an appropriate system component for processing or storage, execute a program stored in memory 904, receive and transmit data via I/O unit 906, or other similar functions. Processing unit 902 can be a central processing unit (CPU), microprocessor, floating point coprocessor, graphics coprocessor, hardware controller, microcontroller, field programmable gate array programmed for use as a controller, network controller, or any type of processor or controller. Furthermore, in many embodiments, there is often no need for a CPU.

For example, instead of a CPU, one or more FPGAs 908 can control the logical operations of the system. As another example, FPGA 908 acts as a reconfigurable processor that can be reprogrammed as needed to handle a particular computing task. Alternatively, FPGA 908 can itself include an embedded microprocessor. Memory unit 904 can be a random access memory (RAM), read only memory (ROM), fixed or flexible disk media, flash memory, tape, or any other storage means, or any combination of these storage means.

The foregoing description of the exemplary embodiments of the present invention has been presented for the purposes of illustration and description. The foregoing description is not intended to be exhaustive or to limit the present invention to the examples disclosed herein. In some instances, features of the present invention can be employed without a corresponding use of other features as set forth. Many modifications, substitutions, and variations are possible in light of the above teachings, without departing from the scope of the present invention.

What is claimed is:

1. A phase interpolator circuit comprising:
   first and second transistors coupled to form a first differential pair;
   first and second load circuits;
   a first switch circuit coupled between the first transistor and the first load circuit;
   a second switch circuit coupled between the second transistor and the second load circuit;
   a first current source circuit; and
   a third switch circuit coupled between the first differential pair and the first current source circuit, wherein a conductive state of each of the first, the second, and the third switch circuits is controlled by both of first and second control signals.

2. The phase interpolator circuit of claim 1, wherein the phase interpolator circuit is operable to generate an output voltage between the first and the second load circuits and between the first and the second switch circuits.

3. A phase interpolator circuit comprising:
   first and second transistors coupled to form a first differential pair;
   first and second load circuits;

a first switch circuit coupled between the first transistor and the first load circuit;

a second switch circuit coupled between the second transistor and the second load circuit;

a first current source circuit a third switch circuit coupled between the first differential pair and the first current source circuit;

third and fourth transistors coupled to form a second differential pair;

a fourth switch circuit coupled between the third transistor and the first load circuit;

a fifth switch circuit coupled between the fourth transistor and the second load circuit;

a second current source circuit; and a sixth switch circuit coupled between the second differential pair and the second current source circuit.

4. The phase interpolator circuit of claim 3, wherein a conductive state of each of the first, the second, and the third switch circuits is controlled by first and second control signals, and wherein a conductive state of each of the fourth, the fifth, and the sixth switch circuits is controlled by third and fourth control signals.

5. The phase interpolator circuit of claim 3, wherein the first current source circuit is a first variable current source circuit comprising seventh switch circuits and a first set of current sources coupled to the seventh switch circuits, and wherein the second current source circuit is a second variable current source circuit comprising eighth switch circuits and a second set of current sources coupled to the eighth switch circuits.

6. The phase interpolator circuit of claim 3 further comprising:

fifth and sixth transistors coupled to form a third differential pair;

a seventh switch circuit coupled between the fifth transistor and the first load circuit;

an eighth switch circuit coupled between the sixth transistor and the second load circuit; and a ninth switch circuit coupled between the third differential pair and the first current source circuit.

7. The phase interpolator circuit of claim 6 further comprising:

seventh and eighth transistors coupled to form a fourth differential pair;

a tenth switch circuit coupled between the seventh transistor and the first load circuit;

an eleventh switch circuit coupled between the eighth transistor and the second load circuit; and a twelfth switch circuit coupled between the fourth differential pair and the second current source circuit.

8. The phase interpolator circuit of claim 7 further comprising:

ninth and tenth transistors coupled to form a fifth differential pair;

a thirteenth switch circuit coupled between the ninth transistor and the first load circuit;

a fourteenth switch circuit coupled between the tenth transistor and the second load circuit;

a fifteenth switch circuit coupled between the fifth differential pair and the first current source circuit;

eleventh and twelfth transistors coupled to form a sixth differential pair;

a sixteenth switch circuit coupled between the eleventh transistor and the first load circuit;

a seventeenth switch circuit coupled between the twelfth transistor and the second load circuit; and an eighteenth switch circuit coupled between the sixth differential pair and the second current source circuit.

9. A phase interpolator circuit comprising:

first and second transistors coupled to form a first differential pair;

first and second load circuits;

a first switch circuit coupled between the first transistor and the first load circuit;

a second switch circuit coupled between the second transistor and the second load circuit;

a first current source circuit a third switch circuit coupled between the first differential pair and the first current source circuit;

third and fourth transistors coupled to form a second differential pair, wherein the second differential pair is coupled to the first and the second load circuits;

fifth and sixth transistors coupled to form a third differential pair, wherein the third differential pair is coupled to the first and the second load circuits;

a second current source circuit coupled to the second differential pair; and a third current source circuit coupled to the third differential pair, wherein each of the third, the fourth, the fifth, and the sixth transistors is operable to receive a constant reference voltage at a control input.

10. A phase interpolator circuit comprising:

first and second transistors coupled to form a first differential pair;

first and second load circuits;

a first switch circuit coupled between the first transistor and the first load circuit a second switch circuit coupled between the second transistor and the second load circuit a first current source circuit a third switch circuit coupled between the first differential pair and the first current source circuit; and a slew rate circuit operable to generate a first periodic signal for transmission to a control input of the first transistor and a second periodic signal for transmission to a control input of the second transistor, wherein the slew rate circuit comprises third and fourth transistors coupled to form a second differential pair.

11. The phase interpolator circuit of claim 1, wherein the first load circuit comprises third and fourth transistors coupled in parallel, and wherein the second load circuit comprises fifth and sixth transistors coupled in parallel.

12. A phase interpolator circuit comprising:

first, second, and third differential pairs of transistors, wherein six periodic input signals having six different phases are concurrently provided to control inputs of transistors in the first, the second, and the third differential pairs of transistors, and wherein the phase interpolator circuit is operable to generate a selected phase in an output signal in response to four of the six periodic input signals.

13. The phase interpolator circuit of claim 12 further comprising:

fourth, fifth, and sixth differential pairs of transistors, wherein eight periodic input signals having eight different phases are concurrently provided to control inputs of transistors in the first, the second, the third, the fourth, the fifth, and the sixth differential pairs of transistors.

14. The phase interpolator circuit of claim 13 further comprising:

seventh and eighth differential pairs of transistors, wherein four of the periodic input signals are provided to control inputs of the seventh and the eighth differential pairs of transistors, wherein the phase interpolator circuit is operable to generate phases in the output signal between 0° and 360°, and wherein the phase interpolator circuit is operable to couple a selected two of the differential pairs of transistors to current sources and load circuits to generate phases in the output signal within a selected 45° range between 0° and 360°.

15. The phase interpolator circuit of claim 13 further comprising:
load circuits; and
first and second current source circuits, wherein the phase interpolator circuit is operable to generate the selected phase in the output signal by coupling a first selected one of the differential pairs of transistors to the load circuits and to the first current source circuit and by coupling a second selected one of the differential pairs of transistors to the load circuits and to the second current source circuit.

16. The phase interpolator circuit of claim 12 further comprising:
first and second load circuits;
a first switch circuit coupled between the first load circuit and a first transistor in the first differential pair of transistors;
a second switch circuit coupled between the second load circuit and a second transistor in the first differential pair of transistors;
a first current source circuit; and
a third switch circuit coupled between the first current source circuit and the first differential pair of transistors.

17. The phase interpolator circuit of claim 16 further comprising:
a fourth switch circuit coupled between the first load circuit and a third transistor in the second differential pair of transistors;
a fifth switch circuit coupled between the second load circuit and a fourth transistor in the second differential pair of transistors;
a second current source circuit; and
a sixth switch circuit coupled between the second current source circuit and the second differential pair of transistors.

18. The phase interpolator circuit of claim 17 further comprising:
a seventh switch circuit coupled between the first load circuit and a fifth transistor in the third differential pair of transistors;
an eighth switch circuit coupled between the second load circuit and a sixth transistor in the third differential pair of transistors; and
a ninth switch circuit coupled between the first current source circuit and the third differential pair of transistors.

19. The phase interpolator circuit of claim 12 further comprising:
first and second load circuits;
a fourth differential pair of transistors coupled to the first and the second load circuits;
a fifth differential pair of transistors coupled to the first and the second load circuits;
a first current source coupled to the fourth differential pair of transistors; and
a second current source coupled to the fifth differential pair of transistors, wherein each of the transistors in the fourth and the fifth differential pairs of transistors is operable to receive a constant reference voltage at a control input.

20. A phase interpolator circuit comprising:
a first differential pair of transistors operable to receive first and second periodic input signals at control inputs;
a second differential pair of transistors operable to receive a constant reference signal at two control inputs;
first and second load circuits coupled to the second differential pair;
a first switch circuit coupled to a first transistor in the first differential pair and the first load circuit; and
a second switch circuit coupled to a second transistor in the first differential pair and the second load circuit.

21. The phase interpolator circuit of claim 20 further comprising:
a third differential pair of transistors operable to receive third and fourth periodic input signals at control inputs;
a fourth differential pair of transistors operable to receive the constant reference signal at two control inputs, wherein the first and the second load circuits are coupled to the fourth differential pair;
a third switch circuit coupled to a third transistor in the third differential pair and the first load circuit; and
a fourth switch circuit coupled to a fourth transistor in the third differential pair and the second load circuit.

22. The phase interpolator circuit of claim 21 further comprising:
a fifth switch circuit coupled to the first differential pair of transistors;
a first variable current source circuit coupled to the fifth switch circuit;
a second variable current source circuit coupled to the second differential pair of transistors;
a sixth switch circuit coupled to the third differential pair of transistors;
a third variable current source circuit coupled to the sixth switch circuit; and
a fourth variable current source circuit coupled to the fourth differential pair of transistors.

* * * * *